United States Patent
Pani et al.

(10) Patent No.: US 11,567,487 B2
(45) Date of Patent: Jan. 31, 2023

(54) FAULT DIAGNOSIS SYSTEM AND METHOD FOR ELECTRIC DRIVES

(71) Applicant: ABB Schweiz AG, Baden (CH)

(72) Inventors: Abhilash Pani, Bangalore (IN); Jinendra Gugaliya, Bangalore (IN); Rahul Kumar-Vij, Bangalore (IN); Promodh Narayan Ravichandran, Bangalore (IN)

(73) Assignee: ABB Schweiz AG, Baden (CH)

(*) Notice: Subject to any disclaimer, the term of this patent is extended or adjusted under 35 U.S.C. 154(b) by 640 days.

(21) Appl. No.: 16/586,877

(22) Filed: Sep. 27, 2019

(65) Prior Publication Data

US 2020/0103885 A1    Apr. 2, 2020

(30) Foreign Application Priority Data

Sep. 28, 2018  (IN) .............................. 201841036779

(51) Int. Cl.
  *G05B 23/02* (2006.01)
  *G06F 11/00* (2006.01)
  (Continued)

(52) U.S. Cl.
  CPC ......... *G05B 23/0235* (2013.01); *G01R 31/34* (2013.01); *G01R 31/343* (2013.01); *G05B 23/0267* (2013.01); *G06F 11/008* (2013.01); *G07C 3/005* (2013.01); *G07C 3/14* (2013.01); *G07C 3/00* (2013.01)

(58) Field of Classification Search
  CPC ............ G05B 23/0235; G05B 23/0267; G05B 23/0275; G01R 31/34; G01R 31/343; G01R 31/00; G06F 11/008; G07C 3/005; G07C 3/14; G07C 3/00
  See application file for complete search history.

(56) References Cited

U.S. PATENT DOCUMENTS

| | | | | |
|---|---|---|---|---|
| 2006/0031042 A1* | 2/2006 | Ogura | ..................... | G06F 11/30 702/184 |
| 2014/0103848 A1* | 4/2014 | Hersh | ..................... | H02P 31/00 318/490 |

(Continued)

FOREIGN PATENT DOCUMENTS

| | | | | |
|---|---|---|---|---|
| CN | 106054858 A | * | 10/2016 | ......... G05B 23/0208 |
| CN | 107471988 A | * | 12/2016 | ............... B60K 1/00 |

*Primary Examiner* — Tarun Sinha
*Assistant Examiner* — Lal C Mang
(74) *Attorney, Agent, or Firm* — Leydig, Voit & Mayer, Ltd.

(57) ABSTRACT

The present disclosure relates to diagnosing a fault in an electric drive of a process plant. The fault diagnosis method includes receiving fault data from an electric drive upon occurrence of the fault. The method further includes obtaining a fault code and a drive type associated with the electric drive from the fault data. In addition, the method comprises determining one or more drive parts to replace by comparing the fault code and the drive type with a mapped data for a plurality of drive types. The mapped data for each drive type includes a relation between a plurality of fault codes and a plurality of drive parts. The method further includes initiating a maintenance operation involving replacement of the one or more drive parts to address the fault.

9 Claims, 6 Drawing Sheets

(51) Int. Cl.
    *G01R 31/34*     (2020.01)
    *G07C 3/14*     (2006.01)
    *G07C 3/00*     (2006.01)

(56) References Cited

U.S. PATENT DOCUMENTS

2018/0031618 A1*   2/2018   Friedlander .......... G01R 21/133
2019/0302710 A1*  10/2019   Neti ..................... G05B 13/042

* cited by examiner

| Fault Information 402 | Fault Code 404 | Electric Drive Information 406 | | Drive Part(s) Replaced 412 | |
|---|---|---|---|---|---|
| | | Drive Type 408 | Drive Location 410 | Part Identifier 414 | Part Description 416 |
| Fault 1 | FC1 | DT1 | Location 1 | PI1 | PD1 |
| Fault 2 | FC2 | DT2 | Location 2 | PI2, PI3 | PD2, PD3 |
| Fault 3 | FC3 | DT3 | Location 3 | PI4, PI5 | PD4, PD5 |
| Fault 1 | FC1 | DT1 | Location 4 | PI1, PI2, | PD1, PD2 |
| Fault 3 | FC3 | DT3 | Location 5 | PI4, PI5 | PD4, PD5 |
| ----- | | | | | ----- |
| Fault n | FCn | DTn | Location n | PIn | PDn |

| Fault 502 | Fault Code 504 | Electric Drive Information 506 | Drive Part(s) To Replace 512 | | First Confidence Value 518 |
|---|---|---|---|---|---|
| | | Drive Type 508 | Part Identifier 514 | Part Description 516 | |
| Fault 1 | FC1 | DT1 | PI1, PI2 | PD1, PD2 | 0.86 |
| Fault 2 | FC2 | DT1 | PI4 | PD4 | 0.65 |
| Fault 3 | FC3 | DT1 | PI5, PI6 | PD5, PD6 | 0.78 |
| Fault 2 | FC2 | DT2 | PI2, PI3 | PD2, PD3 | 0.95 |
| Fault 3 | FC3 | DT3 | PI4, PI5 | PD4, PD5 | 0.75 |
| ----- | | ----- | | ----- | |
| Fault n | FCn | DTn | PIn | PDn | 0.956 |

| Drive Type 602 | One or more Drive Part(s) Replaced together 604 | Count 606 | Second Confidence Value 608 |
|---|---|---|---|
| DT1 610a | Pl2, Pl3, Pl1 -> Pl1,Pl2 610b | 220 610c | 0.98 610d |
| DT1 612a | Pl4, Pl5 -> Pl4 612b | 240 612c | 0.45 612d |
| DT2 614a | Pl1, Pl2, Pl3 -> Pl2 614b | 220 614c | 0.78 614d |
| ----- | ----- | ----- | ----- |
| DTn 616a | Plx, Ply -> Pix 616b | 450 616c | 0.956 616d |

← 600

FAULT DIAGNOSIS SYSTEM AND METHOD FOR ELECTRIC DRIVES

CROSS-REFERENCE TO RELATED APPLICATIONS

This application claims priority to Indian Patent Application No. 201841036779, filed Sep. 28, 2018, the entire disclosure of which is incorporated herein by reference.

TECHNICAL FIELD

The present disclosure relates generally to electric drives used in industrial locations such as process plants and, more particularly, to fault diagnosis systems and methods for such electric drives.

BACKGROUND

Regular maintenance of electric drives is essential to avoid operation downtimes and in turn financial losses. As part of a maintenance procedure, components of an electric drive may need to be replaced on a periodic basis, considering lifespan of the components. For example, air filters may need to be replaced on a yearly basis. Despite such periodic maintenance, faults can occur due to problems in the electric drives or in the operating environment.

When a fault occurs in an electric drive, a fault code that identifies the fault, is displayed on a user interface of the electric drive. The fault code is utilized by a service engineer to infer a cause of the fault. This is typically performed according to the engineer's subject expertise. The service engineer can rely on past experience and/or documents related to fault diagnosis, to identify drive components that are affected. In case the service engineer identifies incorrect components, the electric drive may be adversely affected as a result of the service.

Other approaches of diagnosing faults include identifying solutions to faults by referring to a database that includes recommended solutions to faults. For example, a solution to a fault is identified by matching the fault information with stored fault/solution information in the database. The database with fault history is typically created based on manual reports, and is limited to certain machines.

In an industrial location, electric drives of different type are installed over a large operating area. Similar/identical drives may be installed, and are exposed to similar or different operating conditions. Accordingly, databases populated with fault history may not provide accurate results when used for determining drive components that may be connected with an impending/already occurred drive failure. For example, the databases may not assist in accurately determining drive components exposed to adverse operating conditions, and which may be susceptible to failure or need immediate replacement. As there are a large number of drives that are typically present in an industrial location, keeping drive components handy for maintenance is desired to reduce downtime (if any).

There is accordingly a need for diagnosis of faults occurring in electric drives, according to fault data of different types of electric drives. Such diagnosis should assist in determining drive components in any type of electric drive linked with a fault, for improving overall drive operation, ensuring drive components inventory levels and/or performing desired maintenance/repair.

SUMMARY

An aspect of the present disclosure provides a method for diagnosing a fault in an electric drive. The electric drive is one of a plurality of electric drives of a process plant. The method can be performed by a diagnostic system communicatively coupled to the electric drive via an industrial network. In an example, the diagnostic system has a server, installed in a cloud network, and which is communicatively coupled with the electric drive. Alternatively, the diagnostic system may have a network device, such as a gateway device or a controller capable of communicating with the electric drive.

The method includes receiving fault data from the electric drive upon occurrence of a fault in the electric drive. For example, the system coupled to the electric drive receives the fault data. The fault data includes a fault code, which identifies a fault uniquely from a plurality of faults of the electric drive or a drive component. The fault code depends on the fault and a drive type to which the electric drive belongs to.

An electric drive can be one of several alternate electric drives available for industrial use. For example, there could be variations in the make of drives, the specification of drives, motors they can control etc. Accordingly, different electric drives can be classified as belonging to a plurality of types, wherein drives of one type share common attributes (e.g. have similar configurations, and control motors of particular ratings). Taking an example, Int101 is a fault code that corresponds to a fault in an internal memory of an electric drive belonging to a drive type "X 2.0". Optionally, the fault data includes a drive type of the electric drive.

The method further includes obtaining the fault code and the drive type from the fault data. The fault data can be parsed to retrieve the fault code. In an embodiment, where the drive type is provided in the fault data, the fault data is parsed to retrieve the drive type. Alternately, the drive type is determined from a drive identifier provided in the fault data. For example, the fault data has a machine ID, and the machine ID is compared with stored data to retrieve the drive type. For example, at the diagnostic system, a mapping of the electric drives installed in various plants can be available, and can be utilized to identify the drive type when a machine ID is available.

The method further includes determining one or more drive parts of the electric drive to replace for addressing the fault based on a comparison of the fault code and the drive type with a mapped data for a plurality of drive types. The mapped data includes a relation between a plurality of fault codes and a plurality of drive parts for each drive type. The mapped data is generated from a history data of faults associated with the plurality of electric drive types.

The history data for each fault includes information of one or more drive parts replaced for resolution of the fault and the fault code. The information for each drive part includes one or more of a part identifier and a part description. In an embodiment, the part identifier includes a numeric/alphanumeric code that uniquely identifies the drive part, and the part description includes a name of the drive part. The part description of the each drive part can be selected as a part description that occurs a maximum number of times in the history data for the corresponding drive part or component.

One or more details of each fault in the history data is used for generating the mapped data. Prior to generation of the mapped data, the service details obtained from the history data may need to be preprocessed. This may include excluding data corresponding to periodic maintenance or service, data having obvious errors etc. The faults in history data are accordingly classified based on drive types and fault codes. In an embodiment, a priori algorithm is executed on the history data to generate the mapped data. The mapped data comprises association between the plurality of fault codes and drive parts (components) for each drive type. Thus, for each drive type, the mapped data has information about the drive part(s) to be replaced to address a fault indicated by the corresponding fault code.

In one embodiment, the drive parts mapped against a fault code (for a drive type) represent the drive parts that have been replaced a maximum number of times for the same fault code. A first confidence value is determined based on the number of times the drive part is replaced for resolution of the fault and a number of times of occurrence of the fault for the drive type in history data. The drive parts that are mapped against a fault code can also be determined based on information about drive parts that are frequently replaced together (e.g. observed in the history data). Optionally, for each drive part, a second confidence value is determined based on a number of times the drive part is replaced together with other drive parts for resolution of the fault.

Thus, from the mapped data and the information about the fault code and the drive type, it can be determined which drive parts are associated with the fault and an action is needed. Upon determining the one or more drive parts to replace for the fault from the mapped data, the method includes initiating a maintenance operation to replace the one or more drive parts for resolving the fault.

As an example, even in the fault condition, the drive may be operational, and therefore some inputs to the drive may be controlled to prevent harm to the drive components. Taking another example, a maintenance operation request can be sent to an operator/service engineer, and a maintenance operation involving replacement of the one or more drive parts, can be scheduled. A signal may be communicated to an inventory replenishment/management system, to indicate replenishment of the one or more drive parts required in lieu of the scheduled replacement in the electric drive.

Another aspect of the present disclosure provides a system for diagnosing faults in one or more electric drives of a plurality of electric drives in a process plant. The system is communicatively coupled with each electric drive via an industrial network. The system has a plurality of modules, each of which performs one or more steps of the method described above.

In one embodiment, the system comprises an input unit, a data storage, a mapping unit, a comparator, and an output unit. The modules are implemented with a processor(s) of the system. For example, the modules are implemented with a processor of a server, a gateway device, an edge device or a controller associated with the electric drive (e.g. connected with the drive in the industrial network). In another example, the modules are implemented with a cloud server communicatively connected with the electric drive. In yet another example, the modules are implemented with a network device communicatively coupled via a wireless communication network to an Ethernet adaptor that is coupled to the electric drive. The Ethernet adaptor sends the drive data to the network device (e.g. a server).

In accordance with the embodiment, the input unit receives fault data from an electric drive of the process plant, upon occurrence of a fault in the electric drive. In another embodiment, the input unit receives the fault data from the Ethernet adaptor that is communicatively linked with the each electric drive. The input unit is optionally configured to receive history data of faults associated with the plurality of electric drives. For example, the history data is received from a database.

The mapping unit generates the mapped data from the history data. The mapping unit derives a relation between a plurality of fault codes and a plurality of drive parts for each drive type for generating the mapped data. The mapped data for each drive type includes a plurality of fault codes mapped to a plurality of drive parts. Each fault code is mapped to one or more drive parts, to be replaced for addressing the fault corresponding to the each fault code.

The data storage logs the fault data, and optionally the history data as received from the input unit. History data may also be generated by aggregating the fault data over a period of time. The data storage stores the mapped data for the plurality of drive types, as generated by the mapping unit.

The comparator obtains the fault code from the fault data received at the input unit. The comparator also obtains the drive type of the electric drive from the fault data received at the input unit. In an embodiment, the comparator obtains the drive type of the each electric drive by retrieving the drive type provided in the fault data. In another embodiment, the comparator obtains the drive type from a drive identifier provided in the fault data. The comparator further compares the fault code and the drive type with the mapped data for determining one or more drive parts to replace within the each electric drive. Thus, the comparator is configured to determine the drive parts required to address the fault.

The output unit initiates a maintenance operation to replace the one or more drive parts based on the comparison with the mapped data. In an embodiment, a recommendation comprising the one or more drive parts may be communicated to a network device accessible to a service engineer. Upon receiving the recommendation, the service engineer can carry the one or more drive parts to a location of the electric drive, for effecting resolution of the fault.

BRIEF DESCRIPTION OF DRAWINGS

FIG. 4 is an illustration of a history data of faults associated with a plurality of drive types, according to an embodiment of the present disclosure.

FIG. 5 is an illustration of a mapped data generated from the history data of FIG. 4, according to an embodiment of the present disclosure.

DETAILED DESCRIPTION OF THE DRAWINGS

Figure 1:
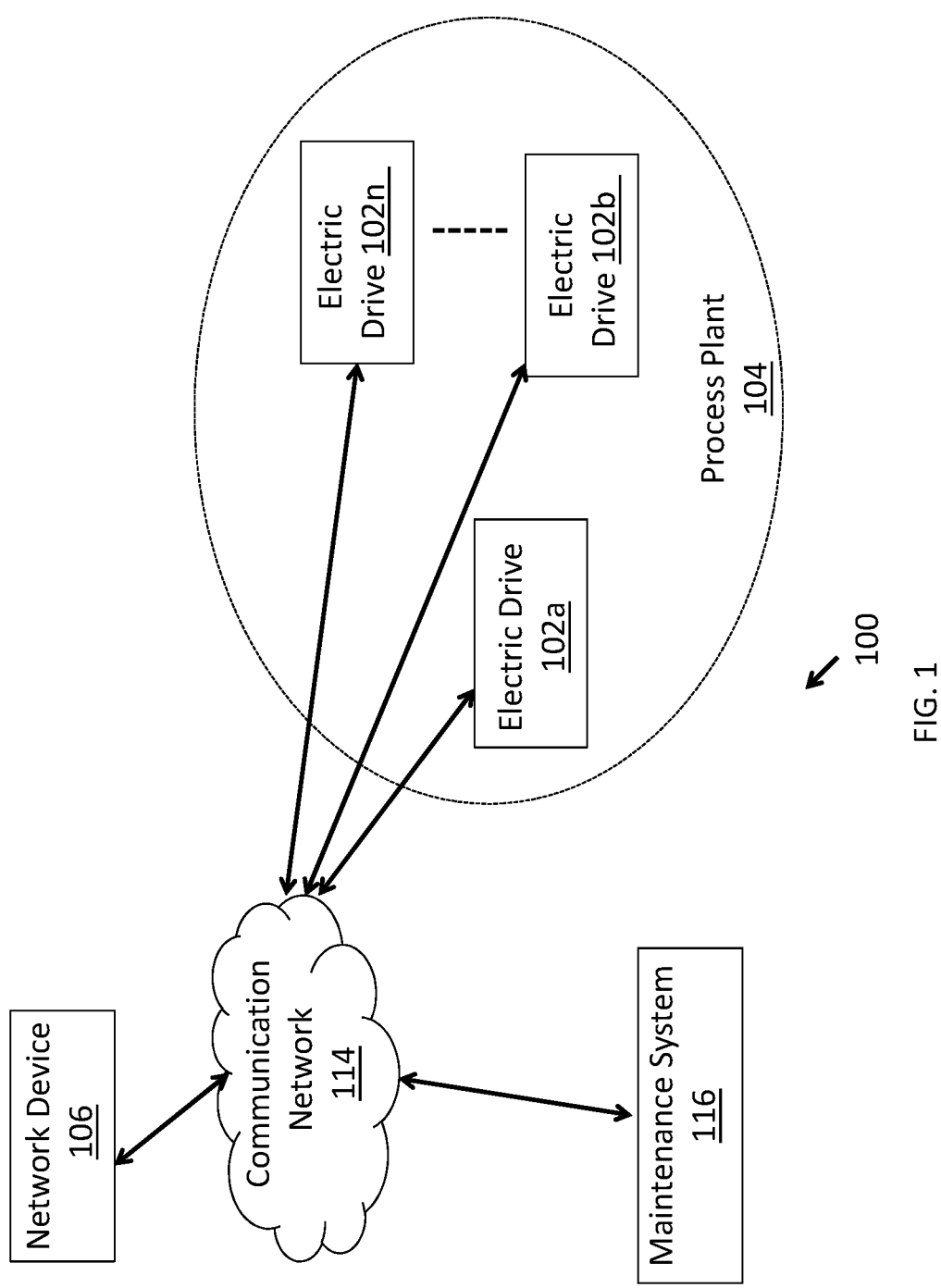
FIG. 1 is a simplified view of an environment in which various embodiments of the present disclosure can be practiced.

The present disclosure is related to diagnosing a fault of an electric drive, where the electric drive is one of a plurality of electric drives operating in a process plant. Various embodiments according to the present disclosure can be practiced in an environment such as environment 100 shown in FIG. 1. The environment shows an industrial network where a plurality of electric drives (102a-n) are in communication with a network device (106) over a communication network (114). The network device is also capable of communicating with a maintenance system (116) over the communication network.

Though the environment shows a single network device diagnosing faults in an electric drive of the plurality of electric drives of a single process plant, it is understood that faults occurring in different electric drives operating in multiple process plants can be diagnosed by a single or multiple network devices. Though the environment shows a single maintenance system, it is understood that multiple maintenance systems can be part of the environment.

In an embodiment, the network device is a server capable of communicating over a communication network (e.g. a cloud connected network). In another embodiment, the network device is one of a gateway device and an edge device capable of communicating with the electric drive (e.g. via a communication interface of the electric drive). For example, the network device may communicate with an Ethernet adaptor that is provided (or communicatively linked) with the electric drive (102a).

The network device communicates with each electric drive to receive fault data related to one or more faults occurring within the electric drive. The network device determines one or more drive parts to replace within the each electric drive to address a fault. The network device may initiate a drive control in response to the fault. Alternately, the network device may communicate a signal to the maintenance system to initiate a maintenance operation for replacing the one or more drive parts. Accordingly, the maintenance personnel can visit the location of the electric drive with the one or more drive parts, and address the fault.

In an embodiment, the network device communicates a signal to an inventory management/replenishment system to manage inventory levels for the one or more drive parts. Based on the signal, the one or more drive parts can be replenished within the inventory. The signal can be tracked through a replenishment cycle for providing visibility to a customer regarding usage and replenishment of drive parts in the inventory management system.

In an embodiment, the network device may provide the recommendation directly to a client device that is associated with a service engineer, designated to repair the electric drive. For example, the client device may display a service portal, on which a plurality of faults occurring in the process plant is viewable, along with a recommendation for addressing each fault.

Figure 2:
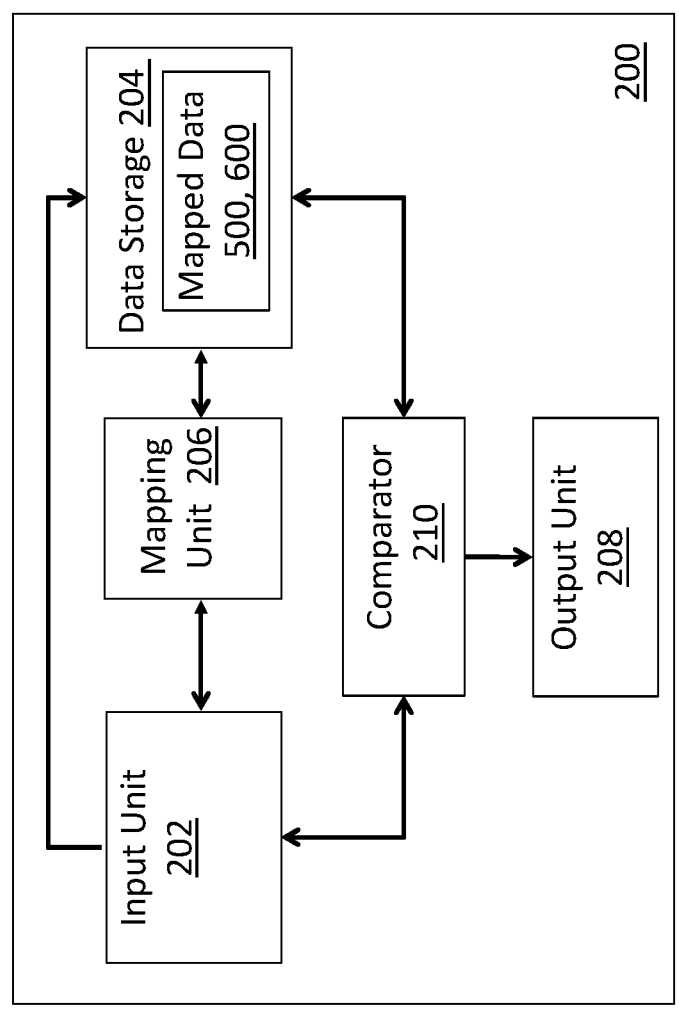
FIG. 2 is a block diagram of a system to diagnose faults in one or more electric drives of a plurality of electric drives, according to an embodiment of the present disclosure.
Figure 3:
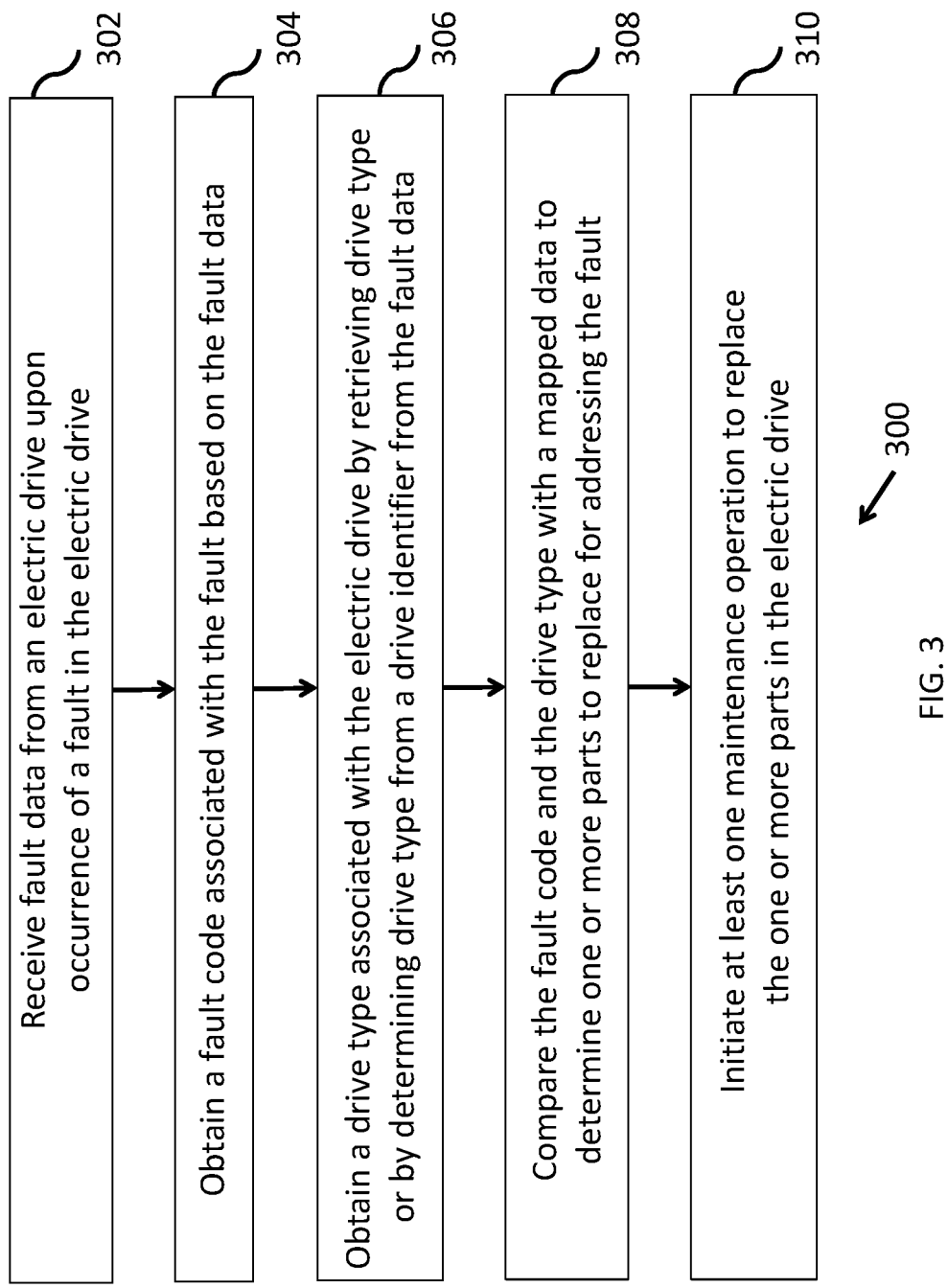
FIG. 3 is a flowchart of a method for diagnosing a fault in an electric drive, according to an embodiment of the present disclosure.

Determining the one or more drive parts for addressing the fault in the electric drive (102a) by the network device (106) is explained in reference to FIGS. 2 and 3.

FIG. 2 is a block diagram of a system (200) for diagnosing faults in a plurality of electric drives of a process plant, according to an embodiment of the present disclosure. The system (200) includes a plurality of modules implemented with one or more processors associated with a device in the industrial network. For example, the modules may be implemented with a processor of the network device, or the modules may be implemented at a server connected with the industrial network, or the modules may be distributed in processors of one or more devices connected in the industrial device (e.g. some modules may be provided in a gateway device and some on the server). In the embodiment of FIG. 2, the system includes an input unit (202), a mapping unit (206), a data storage (204) a comparator (210), and an output unit (208). Each of the plurality of modules performs one or more steps of a method as disclosed in FIG. 3.

FIG. 3 is a flowchart of the method for diagnosing faults in the electric drive (for example 102a). The method may be performed with the system (for example 200 or network device 106) that is communicatively coupled with the electric drive in the industrial network. The fault is diagnosed or addressed by determining one or more drive parts to replace within the electric drive, or to initiate a drive control.

At step 302, fault data is received from the electric drive upon occurrence of a fault. The fault data is received by an input unit (e.g. 202) of a system (e.g. 200). In an embodiment, the fault data includes a fault code corresponding to the fault in the electric drive. In an example, the fault code is an alphanumeric or a numeric code that uniquely identifies the fault. In an embodiment, the fault code depends on a drive type of the electric drive. For example, a fault code associated with an internal memory fault occurring in an electric drive of a first drive type, may be different from a fault code associated with a similar internal memory fault occurring in an electric drive of second drive type.

At step 304, the fault code is obtained from the fault data. The fault code can be obtained (e.g. by the comparator) by parsing the fault data.

At step 306, the drive type associated with the electric drive is obtained (e.g. by the comparator) from the fault data. In an embodiment, where the drive type is provided in the fault data, the fault data is parsed to retrieve the drive type. Alternately, the drive type is determined from a drive identifier provided in the fault data. For example, the fault data has a machine ID, and the machine ID is compared with stored data to retrieve the drive type. For example, within the data storage, a mapping of the electric drives installed in various plants is available. The mapping has machine IDs for each drive, and accordingly can be utilized to identify the drive type when a machine ID is available.

At step 308, the fault code and the drive type is compared with a mapped data (e.g. 500 and 600) for a plurality of drive types, to determine one or more drive parts of the electric drive to replace for addressing the fault or to initiate a drive control. In an embodiment, the mapped data includes a relation between a plurality of fault codes and a plurality of drive parts for each drive type. The mapped data is generated from history data of faults associated with the plurality of electric drive types.

The input unit is configured to receive (or assist in generating) the history data of faults associated with the plurality of electric drives. The history data for each fault includes information of one or more drive parts replaced for resolution of the each fault that occurred in an electric drive. The information for each drive part includes one or more of a part identifier and a part description. In an embodiment, the part identifier includes a numeric/alphanumeric code that uniquely identifies the each drive part, and the part description includes a name of the drive part. An example of history data consolidated with the system is shown in FIG. 4.

FIG. 4 illustrates an example history data (400) of faults associated with a plurality of electric drives $DT_{1-n}$. As shown the history data as consolidated includes fault information (402), fault code (404), electric drive information (406), drive part(s) replaced (412) for resolution of each fault. The electric drive information includes drive type (408) and a drive location (410). The drive location provides the location of the electric drive within a process plant. Further, information regarding the drive part(s) replaced include a part identifier (414) of each drive part replaced and part description (416) of the corresponding drive part(s).

For example, information of a fault 418a, includes a fault information viz. 'Fault 1', the fault code 'FC1', the drive type 'DT1', the drive location 'Location 1', the part identifier (of the drive part replaced for addressing the fault)

'PI1', and the part description 'PD1'. Similarly, information regarding the faults occurring in the plurality of electric drives may be recorded.

In an embodiment, the history data is compiled from a set of service reports collected over a period of time. A service report includes one or more service events, wherein each service event includes information of a fault occurring in an electric drive or a component thereof, and a resolution provided by the service engineer for fixing the fault. The resolution includes information of one or more drive parts replaced by the service engineer in resolving the fault. The service report may also include other details against each service event such as, but not limited to, a drive type, a location, a date and a time of occurrence of the fault, and a time taken for resolution.

One or more details of each fault in the history data is used for creating the mapped data. Prior to creation of the mapped data, the history data may need to be preprocessed. Preprocessing can include, but need not be limited to, creation of a filtered history data by excluding service entries related to periodic maintenance of the plurality of electric drives. Other type of preprocessing can include sanitizing the information in the history data such as, but not limited to, correcting obvious errors, updating old identifiers with new ones etc. Further, service entries containing an invalid or incomplete drive part information can be excluded from the history data. For example, if a service engineer failed to enter a part number or part identifier of a drive part replaced as a resolution of a fault, such service entry can be filtered out from the history data.

From the history data, a description that occurs a maximum number of times in the part description of a drive part can be selected as the part description for the part. Typically, differences in part descriptions provided for a drive part occur when service engineers provide different descriptions for the same drive part. In determining the description for the each drive part, two or more descriptions of a drive part that differ only in terms of textual formats, are considered as the same description for the drive part.

The history data is then classified based on drive types and a plurality of fault codes associated with each drive type. In an embodiment, a priori algorithm is executed over the history data to generate the mapped data (e.g. 500, 600). Other market basket analysis algorithms known in the art may be used for generating the mapped data.

The mapped data comprises association between the plurality of fault codes and one or more drive parts for each drive type. The one or more drive parts are the parts to be replaced to address the fault associated with the fault code. Thus, the mapped data has for each drive type a relation between fault codes and drive parts. The mapping is generated from analysis of the history data (e.g. with the a priori algorithm). In one embodiment, the one or more drive parts in the mapped data are the drive parts that replaced a maximum number of times for providing a resolution for a fault corresponding to the fault code for the drive type. Optionally, the parts that are replaced together (e.g. likely to fail together as learnt from history data) are integrated. That is for a fault code, not only the parts that are replaced the maximum number of times, but also the parts that are likely to fail together are considered for replacement or service.

FIG. 5 illustrates an example of the mapped data 500 created from the history data. As shown, the mapping for a fault (502) includes fault code (504) corresponding to the fault, drive type (508) of the drive in which the fault occurs, a part identifier (514) of a drive part replaced for resolving the fault, a part description (516) of the drive part. Each mapping is associated with a first confidence value (518). For example, for mapping 518*a*, Fault 1, is mapped to a fault code FC1, a drive type DT1, and drive parts PI1, PI2, PI3 with a first confidence value of 0.86. The part descriptions of the drive parts are given as PD1, PD2 and PD3 respectively.

The first confidence value represents a probability of replacing one or more drive parts when a fault code is reported. For example, as shown the mapping 518*a* is associated with a first confidence value of 0.86, which means the drive parts (PI1, PI2 and PI3) associated with the fault were replaced in 86% of the cases when the fault 1 occurred (as reflected in the history data). Hence, if the fault 1 occurred 100 times, it means the drive parts (PI1, PI2 and PI3) were replaced in 86 cases.

A mapping defines one or more drive parts to replace for resolving a fault occurring in the each drive type. A fault code identifies the fault uniquely within the corresponding drive type. For example, the mapping 518*b*, means fault code FC2 is a fault code corresponding to the Fault 2, occurring within an electric drive of the drive type DT1. Further, replacing the drive part bearing part identifier PI4, within the electric drive facilitates resolution of the Fault 2 with a probability of 0.65. Further, description of the drive part is provided as PD4.

In another example, the mapped data may include a mapping or rule viz. Rule1 represented as: Fault Code (FC1)→Insulated Gate Bipolar Transistor (IGBT)→ ACS800→0.87. The mapping may be interpreted as 'FC1' is a fault code related to a fault occurring in an IGBT of an electric drive belonging to the 'ACS800' electric drive family Hence replacing the IGBT within an electric drive having a fault corresponding to FC1 facilitates resolution of the fault.

In an embodiment, a rule of the mapped data may also include a number of times/cases the rule was applied (i.e. the same parts were replaced) when the fault corresponding to the rule was reported. In the above example, if the Rule1 is associated with 1778 cases and with 0.87 as the first confidence value, it means the IGBT (drive part) was replaced in 1778 cases, and the IGBT was replaced in 87% of the cases the fault occurred in the history data.

Figure 6:
FIG. 6 is an illustration of a mapped data generated from the history data of FIG. 4, according to an embodiment of the present disclosure.

The mapped data may be generated to include a plurality of rules that identify one or more drive parts that are frequently replaced together as shown in FIG. 6.

FIG. 6 illustrates the mapped data (600) where for each drive type (602), a mapping or rule is identified that includes one or more drive part(s) replaced together (604), a number of times the drive part(s) are replaced together (606) and a second confidence value (608). The second confidence value is determined based on a number of times the one or more drive parts is replaced together for resolution of one or more faults occurring in the history data. As shown, a rule for drive type (DT1) (610*a*) provides that drive parts PI1, PI2 and PI3 are replaced together. Further, the rule states that the drive parts PI1, PI2 and PI3 are replaced 220 times together for resolution of one or more faults with a second confidence value of 0.98.

In an example, a rule of the mapped data (600) defined as: "(DC Capacitor (9 pc), Gate Driver Board)=>(Discharging Resistor), 217 Counts, a second confidence value of 0.82", implies that when the DC capacitor is replaced the gate driver board is also replaced. Further, the count 217 implies that the rule occurred 217 times in the history data 82% times.

Thus, the mapped data can have mapping between fault codes and drive parts based on both the number of times the drive parts are replaced as mentioned in the service reports, and based on the data of parts that are replaced together. For example, as shown in mapped data (500), rule 518*a*, provides that for resolution of Fault 1, occurring in a drive type (DT1), drive parts (PI1 and PI2) are replaced with a first confidence value of 0.86. Now, as shown in mapped data (600), a rule for drive type (DT1) includes replacing drive parts (PI1, PI2, and PI3) 610*b* together when drive parts (PI1 and PI2) are replaced. As the second confidence value of 0.98 is higher than the first confidence value of 0.86, when an instance of the Fault 1 occurs in an electric drive of the drive type (DT1), the drive parts (PI1, PI2 and PI3) is determined, as a resolution of the fault against the fault code.

At step 310, a maintenance operation to replace the one or more drive parts for resolving the fault is initiated.

In an embodiment, a maintenance operation request is sent to an operator/service engineer, and a maintenance operation involving replacement of the one or more drive parts is scheduled. A signal may be communicated in parallel to an inventory replenishment/management system, to initiate replenishment of the one or more drive parts required in lieu of the scheduled replacement in the electric drive. The replenishment provides visibility on the one or more drive parts, and on a consumption rate of the drive parts utilized in the process plant. As a result, the inventory management system can be kept replenished on a periodic basis. Such replenishment avoids operation downtimes occurring due to unavailability or prolonged wait time for procuring the drive parts required for the fault diagnosis.

Thus, the present disclosure makes use of fault data generated by different electric drives across the same or different plants. The fault data is consolidated (as history data) and analyzed to map fault codes with drive parts that should be replaced to provide the required resolution. Additionally, drive controls to mitigate further damage can be mapped to the fault codes. With the mapped data, the disclosed method and system enables efficient diagnosis of faults occurring in the electric drives of a process plant. The diagnostic recommendation of replacing one or more drive parts for resolution of the faults results in reducing an overall repairing time of the electric drive, and/or in preventing further failures. The recommendation of the one or more drive parts can also be used in an inventory management system, to replenish stock of drive parts that need to be replaced. Accordingly, the systems and method of the present disclosure ensure an adequate stock of drive parts that are required for resolution of faults.

The invention claimed is:

1. A method for diagnosing a fault in an electric drive, wherein the electric drive is one of a plurality of electric drives of a process plant, the method comprising:
   receiving fault data from the electric drive, upon occurrence of the fault in the electric drive, wherein the fault data comprises a fault code indicative of the fault associated with the electric drive;
   obtaining a drive type associated with the electric drive, based on the fault data, wherein the drive type is obtained by one of (i) retrieving the drive type provided in the fault data and (ii) determining the drive type from a drive identifier provided in the fault data;
   determining one or more drive parts to replace to address the fault corresponding to the fault code and the drive type, based on a comparison of the fault code and the drive type with mapped data for a plurality of drive types, wherein the mapped data for each drive type includes a relation between a plurality of fault codes and a plurality of drive parts, and wherein the mapped data is generated by determining a first confidence value for each drive part associated with a fault code of the plurality of fault codes for each drive type, wherein the first confidence value is determined based on the number of times the drive part is replaced for resolution of the fault and the number of times of occurrence of the fault for the drive type in the history data; and
   initiating a maintenance operation to replace the one or more drive parts based on the comparison with the mapped data.

2. The method of claim 1, wherein the mapped data is generated from history data of faults associated with the plurality of electric drive types, wherein the history data for each fault includes information of one or more drive parts replaced for the each fault, wherein the information for each drive part includes one or more of a part identifier and a part description.

3. The method of claim 2, wherein the mapped data is generated by associating each fault code with one or more drive parts based on the history data of faults for each drive type.

4. The method of claim 3, wherein the mapped data is generated by determining, for each drive part, one or more drive parts to replace together based on a second confidence value, wherein the second confidence value is determined based on a number of times the one or more drive parts are replaced together for resolution of one or more faults occurring in the history data, wherein the one or more drive parts includes the each drive part.

5. The method of claim 4, wherein the mapped data is generated by associating the one or more drive parts with the each drive part and with the fault code.

6. A system for diagnosing faults in one or more electric drives of a plurality of electric drives of a process plant, wherein the system is communicatively coupled with each electric drive via an industrial network, the system comprising:
   an input unit to receive fault data from an electric drive, upon occurrence of the fault in the electric drive, wherein the fault data comprises a fault code indicative of the fault associated with the electric drive;
   a mapping unit to generate a mapped data from history data, wherein the mapped data for each drive type includes a plurality of fault codes mapped to a plurality of drive parts, and wherein the mapped data is generated by determining a first confidence value for each drive part associated with a fault code of the plurality of fault codes for each drive type, wherein the first confidence value is determined based on the number of times the drive part is replaced for resolution of the fault and the number of times of occurrence of the fault for the drive type in the history data;
   a data storage to store a mapped data for a plurality of drive types, wherein the mapped data for each drive type includes a relation between a plurality of fault codes and a plurality of drive parts;
   a comparator to:
      obtain the drive type of the each electric drive by one of (i) retrieving the drive type provided in the fault data and (ii) determining the drive type from a drive identifier provided in the fault data; and
      compare the fault code and the drive type with the mapped data for determining one or more drive parts to replace within the electric drive to address the fault corresponding to the fault code and the drive type; and an output unit to initiate a maintenance operation to replace the one or more drive parts based on the comparison with the mapped data.

7. The system of claim 6, wherein the input unit receives the history data of faults associated with the plurality of electric drives, wherein the history data for each fault includes information of one or more drive parts replaced for the each fault, and wherein the information for each drive part includes one or more of a part identifier and a part description.

8. The system of claim 7, wherein the mapping unit is to select a part description of the each drive type of the mapped data as a description occurring a maximum number of times in the part description of the each drive part present in the history data.

9. A method for diagnosing a fault in an electric drive, wherein the electric drive is one of a plurality of electric drives of a process plant, the method comprising:

receiving fault data from the electric drive, upon occurrence of the fault in the electric drive, wherein the fault data comprises a fault code indicative of the fault associated with the electric drive;

obtaining a drive type associated with the electric drive, based on the fault data, wherein the drive type is obtained by one of (i) retrieving the drive type provided in the fault data and (ii) determining the drive type from a drive identifier provided in the fault data;

determining one or more drive parts to replace to address the fault corresponding to the fault code and the drive type, based on a comparison of the fault code and the drive type with mapped data for a plurality of drive types, wherein the mapped data for each drive type includes a relation between a plurality of fault codes and a plurality of drive parts, and wherein the mapped data is generated by determining a first confidence value for each drive part associated with a fault code of the plurality of fault codes for each drive type, wherein the first confidence value is determined based on the number of times the drive part is replaced for resolution of the fault and the number of times of occurrence of the fault for the drive type in the history data;

determining, for each drive part, one or more drive parts to replace together based on a second confidence value, wherein the second confidence value is determined based on a number of times the one or more drive parts are replaced together for resolution of one or more faults occurring in the history data, wherein the one or more drive parts includes the each drive part; and initiating a maintenance operation to replace the one or more drive parts based on the comparison with the mapped data.

* * * * *